(12) United States Patent
Sellschopp et al.

(10) Patent No.: US 11,075,333 B2
(45) Date of Patent: Jul. 27, 2021

(54) APPARATUS AND METHOD FOR CONVERTING THERMAL ENERGY INTO ELECTRICAL ENERGY

(71) Applicant: LEIBNIZ-INSTITUT FÜR FESTKÖRPER-UND WERKSTOFFFORSCHUNG DRESDEN E.V., Dresden (DE)

(72) Inventors: Kai Sellschopp, Hamburg (DE); Sebastian Faehler, Dresden (DE); Anja Waske, Dresden (DE)

(73) Assignee: LEIBNIZ-INSTITUT FÜR FESTKÖRPER-UND WERKSTOFFFORSCHUNG DRESDEN E.V., Dresden (DE)

( * ) Notice: Subject to any disclaimer, the term of this patent is extended or adjusted under 35 U.S.C. 154(b) by 0 days.

(21) Appl. No.: 16/461,668

(22) PCT Filed: Nov. 16, 2017

(86) PCT No.: PCT/EP2017/079416
§ 371 (c)(1),
(2) Date: May 16, 2019

(87) PCT Pub. No.: WO2018/091573
PCT Pub. Date: May 24, 2018

(65) Prior Publication Data
US 2019/0355892 A1    Nov. 21, 2019

(30) Foreign Application Priority Data

Nov. 18, 2016 (DE) ..................... 10 2016 122 274.7
Nov. 15, 2017 (DE) ..................... 10 2017 126 803.0

(51) Int. Cl.
*H01L 37/04* (2006.01)
*H02N 3/00* (2006.01)

(52) U.S. Cl.
CPC ............... *H01L 37/04* (2013.01); *H02N 3/00* (2013.01)

(58) Field of Classification Search
CPC .......... H01L 37/04; H02N 3/00; H02N 10/00; F03G 7/06
(Continued)

(56) References Cited

U.S. PATENT DOCUMENTS

2005/0046300 A1* 3/2005 Salem ................. H02K 1/02
310/216.006
2007/0247017 A1* 10/2007 Bumby ................ H02K 21/24
310/268

FOREIGN PATENT DOCUMENTS

CN        103060692    *  4/2013
DE        3 106 520       12/1982
(Continued)

OTHER PUBLICATIONS

L. Brillouin et al., "Thermomagnetic Generator", Electrical communication 25(3), (1948), pp. 300-311.
(Continued)

*Primary Examiner* — Ahmed Elnakib
(74) *Attorney, Agent, or Firm* — Greenblum & Bernstein, P.L.C.

(57) ABSTRACT

Apparatus and method for converting thermal energy into electric energy, for example, in the automotive industry or geothermal energy. The apparatus and a method convert thermal energy into electric energy with an improved overall output and an increased maximum attainable output that is simple and cost-efficient to produce and use. The apparatus has one or more thermomagnetic generators, which contain at least one first and second thermomagnetic component, at least two components made of hard magnetic material, at least one coil and at least two connecting elements made of magnetic flux-conducting material; The magnetic north poles are connected to one of the two connecting elements made of magnetic flux-conducting material and the magnetic south poles thereof are connected to the other connecting element.

16 Claims, 1 Drawing Sheet

Figure 1:
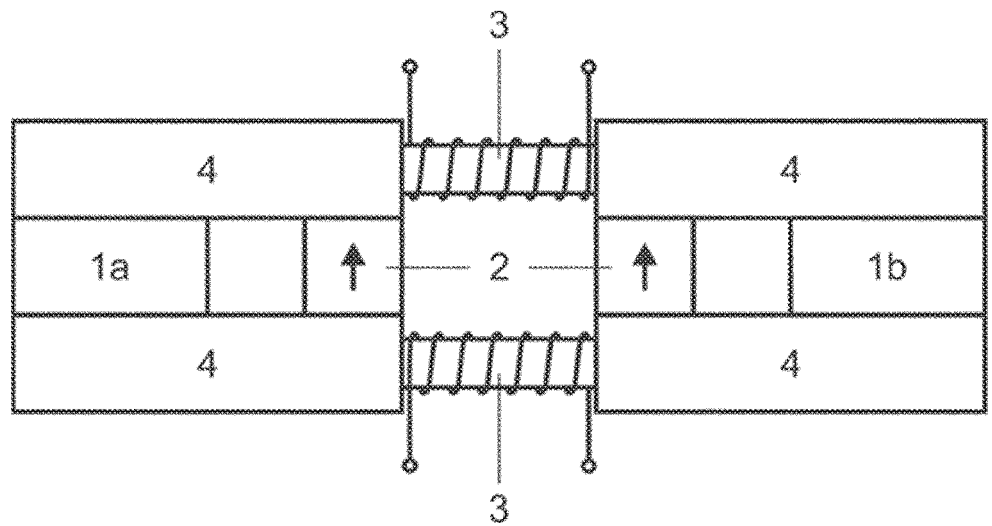

(58) Field of Classification Search
USPC .................................................. 310/310, 306
See application file for complete search history.

(56) References Cited

FOREIGN PATENT DOCUMENTS

| | | | |
|---|---|---|---|
| DE | 3106520 | * | 12/1982 |
| DE | 3 729 348 | | 3/1988 |
| DE | 3 732 312 | | 4/1989 |
| DE | 10 2007 023 505 | | 11/2008 |
| DE | 10 2012 020 486 | | 5/2013 |
| EP | 2 465 119 | | 2/2011 |
| EP | 2 408 033 | | 1/2012 |
| JP | H07-107764 | | 4/1995 |
| WO | 2009/133047 | | 11/2009 |
| WO | 2010/139538 | | 12/2010 |

OTHER PUBLICATIONS

Int'l Search Report (Form PCT/ISA/210) conducted in Int'l Appln. No. PCT/EP2017/079416 (dated Feb. 28, 2018).
Written Opinion (Form PCT/ISA/237) conducted in Int'l Appln. No. PCT/EP2017/079416 (dated Feb. 28, 2018) (w/ English translation thereof).

* cited by examiner

APPARATUS AND METHOD FOR CONVERTING THERMAL ENERGY INTO ELECTRICAL ENERGY

The invention concerns the field of energy engineering and relates to an apparatus and a method for converting thermal energy into electric energy, as can be used for example in the automotive industry, in the chemical industry or on mainframe computers to convert waste heat or heat from the environment (geothermal energy) into electric energy.

The principal of the thermomagnetic generator has already been known since the 19th century. The theoretically established operating principle of a thermomagnetic generator was demonstrated in particular by the findings of Brillouin and Iskenderian (Brillouin, L. and Iskenderian H. P.: "Thermomagnetic Generator," Electrical communication 25(3), 300-311 (1948)). Two soft magnetic materials A and B are thereby heated and cooled in an alternating manner, whereby the relative permeability $\mu_r$ and therefore also the magnetization is changed. A permanent magnet in a coil generates a magnetic flux which, depending on the temperature of the soft magnetic material, is guided either through coil A or B. The change in the magnetic flux then results in an induced current in the coils.

The particular advantage of thermomagnetic generators is that thermal energy can be directly converted into electric energy in that a magnetic phase transformation of a thermomagnetic material is utilized, whereby no intermediate conversion into mechanical energy is necessary. The magnetization and the permeability of the thermomagnetic material change as a result of the phase transformation. If a coil is positioned around a thermomagnetic material of this type, an electric current is induced.

Thermomagnetic generators can be used particularly effectively at small temperature differences up to 120° C. The materials used in thermomagnetic generators are, for example, $Bi_2Te_3$, PbTe, SiGe, BiSb, or $FeSi_2$.

In recent times, materials that exhibit a magnetocaloric effect (MCE) have also been used as thermomagnetic material for thermomagnetic generators. In a material that exhibits a magnetocaloric effect, the alignment of randomly oriented magnetic moments using an external magnetic field results in a heating of the magnetocaloric material. This heat can be dissipated into the ambient atmosphere by the MCE material by means of a heat transfer. If the magnetic field is then shut off or removed, the magnetic moments revert to a random arrangement, which leads to a cooling of the material at ambient temperature. This effect can, on the one hand, be used for cooling purposes; on the other hand, it can be used to convert heat into electric energy.

The particular advantage of magnetocaloric materials with a pronounced MCE is, in particular, that the magnetization thereof changes markedly within a relatively small temperature range.

From DE 3 732 312 A1, a magnetocaloric inductor for generating electric energy is known which is composed of one to two magnetic circuits with permanent magnets and dynamo sheet cores that are separated from yoke plate cores over the entire core cross-sectional area thereof by an air gap filled with metamagnetic layers.

From EP 2 465 119 A1, a heat exchanger bed composed of a cascade of at least three different magnetocaloric materials having different Curie temperatures is known, which materials are arranged in series by increasing or decreasing Curie temperature and are preferably each insulated from one another by thermal and/or electrical insulators positioned therebetween, wherein the difference in the Curie temperatures of adjacent magnetocaloric materials is 0.5 to 2.5° C.

EP 2 408 033 B1 discloses a power generation apparatus which comprises a plurality of thermomagnetic generators, wherein each of the thermomagnetic generators comprises a thermomagnetic material, a coil that surrounds a thermomagnetic material, and a fluid mixer for mixing a first fluid with a second fluid and for outputting the mixed fluid to the thermomagnetic material, wherein a fluid temperature of the first fluid differs from the fluid temperature of the second fluid, and wherein a flow controller controls the amount and the flow rate of the second fluid into the thermomagnetic generators, wherein the first fluid exhibits a constant flow.

From DE 10 2012 020 486 A1, a thermomagnetic generator is known that contains a switch valve, a reservoir for hot and cold fluids and pipelines for these fluids, multiple magnetic circuit units, a coil, and multiple inlet pipes which connect the magnetic circuit units to the switch valve. Each of the magnetic circuit units contains one magnetocaloric element. The switch valve repeatedly and alternatingly switches at a predetermined frequency in order to guide hot and cold fluids to the magnetic circuit units so that the magnetocaloric elements are magnetized and demagnetized by the cold and hot fluids. The coil is coupled to at least one of the magnetic circuit units in order to obtain an induced voltage.

From WO 2009 133 047 A2, a thermomagnetic generator is known which converts thermal energy into electric energy without intermediate conversion to mechanical work, works at temperatures in the range of −20° C. to 200° C., and contains a thermomagnetic material that is selected from compounds of the general formula (I) $(A_yEt_{y-1})_{2+\delta}C_wD_x E_z$, or a compound of the formula $La(Fe'x'Al_{1-x})_{13}H_y$, or $La(Fe_xSi_{1-x})_{13}H_y$, or Heusler alloys of the type MnTP, or compounds of the formula $Gd_5(Si_xGe_{1-x})_4$, $Fe_2P$-based compounds, or manganites of the perovskite type, or compounds of the formula $Tb_5(Si_{4-x}Ge_x)$, or compounds of the formula $Mn_{2-x}Z_xSb$ or $Mn_2Z_xSb_{1-x}$.

From DE 31 06 520 A1 is known an apparatus for converting thermal energy into electric energy by means of a magnetic system which is composed of permanent magnets, yoke and core parts as conducting pieces, and a switching part with temperature-dependent magnetic properties for switching the magnetic flux. The arrangement of the apparatus renders it possible to switch the magnetic flux between two induction coils using two thermomagnetic components in that the magnetic field circuits for the two induction coils are switched in an alternating manner by the thermomagnetic components. Due to the switching of the magnetic flux between these two induction coils, the magnetic flux direction in the respective induction coils remains unchanged, however.

From JP H07-107 764 A, a thermomagnetic apparatus is known which comprises two permanent magnets and two thermomagnetic components which are part of a magnetic field circuit. The two magnetic field circuits are thereby coupled to one another by a coil such that the magnetic flux direction is reversed, but such that only one of the magnetic field circuits is ever closed by magnetic material.

A disadvantage of this solution is that the magnetic flux within a thermomagnetic generator is realized via air. It is known that air has a significantly lower permeability $\mu$ (approx. 1 to $4 \cdot 10^{-7}$). Because the energy density of a magnetic field B is described by $u = \frac{1}{2} B^2/\mu$, the flux guidance via air requires a significantly greater amount of energy than the flux guidance via soft magnetic material. Thus, for an unchanged induced effective electric output, more thermal output must be provided, which reduces the efficiency and the output of a thermomagnetic generator.

It is also disadvantageous that known apparatuses with a thermomagnetic generator have a maximum attainable output that is still too low, and that the production and use thereof is complex and cost-intensive.

The object of the invention is to provide an apparatus for converting thermal energy into electric energy, which apparatus has, compared to the solutions from the prior art, an improved overall output and an increased maximum attainable output, and which is simple and cost-efficient to produce and use.

In addition, the object of the invention is to disclose a method for converting thermal energy into electric energy, with which method an improved and increased output can be attained when converting thermal energy into electric energy.

The object is attained by the invention disclosed in the claims. Advantageous embodiments are the subject of the dependent claims, wherein the invention also includes combinations of the individual dependent claims within the meaning of a logical and-operation, provided that they are not mutually exclusive.

The apparatus according to the invention for converting thermal energy into electric energy comprises one or more thermomagnetic generators, wherein a thermomagnetic generator contains at least one first and one second thermomagnetic component, at least two components made of hard magnetic material, at least one coil, and at least two connecting elements made of magnetic flux-conducting material, wherein the thermomagnetic components and the at least two components made of hard magnetic material are respectively arranged such that they are locally separate from one another, and wherein the thermomagnetic components and the components made of hard magnetic material are connected to the at least two connecting elements made of magnetic flux-conducting material, and wherein the thermomagnetic components are arranged such that they are locally separate from the at least one coil, and wherein the at least one coil comprises as a coil core at least one subregion of the connecting element made of magnetic flux-conducting material, and wherein the at least two thermomagnetic components, the at least two connecting elements made of magnetic flux-conducting material, the at least two components made of hard magnetic material, and the at least one coil are embodied to form at least two magnetic circuits, wherein the magnetic north poles of the at least two components made of hard magnetic material are connected to one of the two connecting elements made of magnetic flux-conducting material, and the magnetic south poles thereof are connected to the other connecting element of the two connecting elements made of magnetic flux-conducting material.

It is advantageous if the thermomagnetic components and the components made of hard magnetic material are magnetically connected to the at least two connecting elements made of magnetic flux-conducting material.

It is also advantageous if the thermomagnetic components contain at least one magnetocaloric material which is advantageously La—Fe—Si, $Fe_2P$, and/or one or more Heusler alloys.

And it is further advantageous if the magnetic circuits, with the exception of the at least one coil, are arranged in an opposing manner with mirror symmetry.

In an advantageous embodiment, the thermomagnetic material exhibits a change in magnetization of M>50% at a temperature change of up to 20 Kelvin.

It is also advantageous if the thermomagnetic components are present in the form of powder, tubes, plates, mesh, grids, bands, wires, and/or rods.

It is also advantageous if the component made of hard magnetic material is a permanent magnet, in particular a permanent magnet made of Nd—Fe—B.

Advantageously, the at least two connecting elements made of magnetic flux-conducting material are made of soft magnetic material, in particular Fe—Si and/or amorphous Fe-based alloys.

In a particularly advantageous embodiment, the at least two connecting elements made of magnetic flux-conducting material are embodied to be annularly closed.

Likewise advantageously, the at least two connecting elements made of magnetic flux-conducting material comprise, at least in the region of the at least one coil, one or more crystallographic textures.

In another advantageous embodiment, at least one heat supply device is present for each thermomagnetic component and at least one heat dissipation device is present for each thermomagnetic component, wherein it is particularly advantageous if regulating devices and/or control devices are present.

In a particularly advantageous embodiment of the apparatus, multiple thermomagnetic generators are connected in series as a cascade, wherein it is particularly advantageous if the first and second thermomagnetic components of one thermomagnetic generator in a cascade respectively have different Curie temperatures than the other first and second thermomagnetic components of the other thermomagnetic generators in the cascade.

According to the invention, a method for converting thermal energy into electric energy by means of the apparatus according to the invention is also disclosed, in which method a first thermomagnetic component is heated and simultaneously a second thermomagnetic component is cooled, whereby the magnetization in the thermomagnetic components is changed and, at the same time, a directed magnetic flux is realized in a first magnetic circuit by the hard magnetic components, and electric energy is induced in the at least one coil by the magnetic flux change in the at least two connecting elements made of magnetic flux-conducting material, and subsequently the first thermomagnetic component is cooled and simultaneously the second thermomagnetic component is heated, whereby the magnetization in the thermomagnetic components is changed and, at the same time, an oppositely directed magnetic flux is realized in a second magnetic circuit by the hard magnetic components, and electric energy is induced in the same at least one coil by the change in direction of the magnetic flux over the at least two connecting elements made of magnetic flux-conducting material.

With the solution according to the invention, an apparatus is provided which has, compared to the solutions from the prior art, an improved overall output and an increased maximum attainable output, and which is simple and cost-efficient to produce and use.

It is thereby particularly important that, as a result of the apparatus according to the invention which comprises one or more thermomagnetic generators, a change in the direction of the magnetic flux is realized in the connecting elements made of magnetic flux-conducting material in the region of the one or more coils, which causes a significantly higher induction in the coil(s) and thus results in a significant increase in the output of the thermomagnetic generator. However, the maximum attainable output is also increased, since the maximum attainable output is proportional to the square of the magnetic flux change, and an increase in the flux change therefore leads to a significant increase in output.

This is achieved in that, with the at least one thermomagnetic generator, at least one first and one second thermomagnetic component, at least two components made of hard magnetic material, at least one coil, and at least two connecting elements made of magnetic flux-conducting material are present, wherein two magnetic circuits that reciprocally realize a directed magnetic flux are respectively formed by the arrangement according to the invention.

Within the scope of the invention, a thermomagnetic component is to be understood as meaning a component that realizes a change in magnetization during a temperature change. It is thereby advantageous if the thermoelectric component is made of a material in which a change in magnetization of >50% at temperature gradients of 20 Kelvin is achieved. Such materials can, for example, be magnetocaloric materials, in particular La—Fe—Si alloys, $Fe_2P$, and/or Heusler alloys.

In terms of the apparatus, the thermomagnetic components and the at least two components made of hard magnetic material are respectively arranged such that they are locally separate from one another. The thermomagnetic components and the components made of hard magnetic materials are thereby connected to the at least two connecting elements made of magnetic flux-conducting material, wherein it is advantageous for an essentially lossless constant magnetic flux in the thermomagnetic generator if the thermomagnetic components and the components made of hard magnetic material are connected at least magnetically to the at least two connecting elements made of magnetic flux-conducting material. It is thus achieved that the magnetic flux remains perpendicular to the boundary surface at the boundary surface between the connecting elements made of magnetic flux-conducting material, the components made of hard magnetic material, and the thermomagnetic components, and that the magnetic flux in the connecting elements made of magnetic flux-conducting material is equal to the magnetic flux in the thermomagnetic components and the components made of hard magnetic material.

In this manner, it is achieved that the magnetic flux is guided in the magnetic material and not through air, which is an essential feature of the invention.

It is likewise particularly important for the solution according to the invention that the thermomagnetic components are arranged such that they are locally separate from the at least one coil, and that each coil comprises as a coil core at least one subregion of the connecting element made of magnetic flux-conducting material.

It is thus achieved that, by heating the at least one thermomagnetic component and by simultaneously cooling the at least second thermomagnetic component, a magnetic field is generated by the heated first thermomagnetic component. This magnetic field is activated by the at least two components made of hard magnetic material, and a directed magnetic flux is realized by the at least two connecting elements made of magnetic flux-conducting material and by the at least one coil.

Due to the locally separate arrangement of the at least one coil from the thermomagnetic components, it is achieved that the geometry of the at least one coil can be designed independently of the design of the thermomagnetic components. Thus, the at least one coil and the at least two thermomagnetic components can be coordinated independently of one another with the magnetic flux generated by the at least two hard magnetic components. This simplifies the calculation and determination of the parameters necessary for the design of the coil and of the thermomagnetic components, and results in the ability to conserve expensive hard magnetic material.

Furthermore, according to the invention it is necessary that at least two thermomagnetic components, at least two connecting elements made of magnetic flux-conducting material, at least two components made of hard magnetic material, and at least one coil are embodied to form at least two magnetic circuits.

As a result of the arrangement of the at least two components made of hard magnetic material respectively before and after a coil in the magnetic circuit, a directed magnetic flux is ensured in the magnetic circuit and therefore in the at least one coil.

As a result of the fact that, in the present invention, the coil is arranged around at least one subregion of a connecting element made of magnetic flux-conducting material, a greater magnetization compared to known coil cores made of thermomagnetic material is achieved and the maximum flux density of the magnetic flux-conducting material of the connecting elements is significantly better utilized. This results in a greater induction in the at least one coil, and therefore in a significantly better output of the thermomagnetic generator. In addition, hysteresis losses only occur as a result of the coercive field, which losses are substantially smaller with connecting elements made of magnetic flux-conducting material compared to thermomagnetic components.

It is particularly advantageous if the at least two thermomagnetic components are present in the form of powder, tubes, plates, mesh, grids, bands, wires, and/or rods. It is thus achieved that there is only a small gap between the thermomagnetic component and the remaining magnetic circuit. This results in a reduction in the drop-off of the magnetic field in the magnetic circuit and therefore in a reduction in the required magnetic mass of the components and connecting elements used.

There is a further advantage of embodying thermomagnetic components in the form of powder, tubes, plates, mesh, grids, bands, wires, and/or rods if the heat exchange medium is in direct contact with the thermomagnetic material and can flow through the thermomagnetic components. In this manner, the magnetocaloric effect can be utilized in a particularly advantageous manner, and the output of the thermomagnetic generator can be improved.

With the solution according to the invention, it is achieved that, through the reciprocal heating and cooling of the first and second thermomagnetic components, the magnetic flux direction in the magnetic circuit is at least reversible in the at least one coil. Through the connection according to the invention of the magnetic north poles of the at least two components made of hard magnetic material to one of the two connecting elements made of magnetic flux-conducting material and the connection of the magnetic south poles thereof to the other connecting element of the two connecting elements made of magnetic flux-conducting material, it is achieved that a directed magnetic flux is realized which results in a reversal of the magnetic flux direction within the at least one coil.

The reversal of the magnetic flux at least within the at least one coil is realized according to a magnetic protagonist/antagonist principle. After the heating of the first thermomagnetic component and the cooling of the second thermomagnetic component, the reversal of the magnetic flux is realized in that at least one second thermomagnetic component is heated and at least one first thermomagnetic component is cooled. As a result, a permeability change is effected in the thermomagnetic components, whereby a reversal of the magnetic flux in the connecting elements made of magnetic flux-conducting material, and therefore in the at least one coil, is realized. With the reversal of the magnetic flux directly in the coil, it is then possible to significantly increase the flux change and, at the same time, substantially reduce the undesired influence of the residual magnetism.

It is particularly advantageous if the connecting elements made of magnetic flux-conducting material comprise, at least in the region of the coil, one or more crystallographic textures. Within the scope of the invention, crystallographic texture is to be understood as meaning one or more preferred orientations of the crystallites of a multi-crystalline solid, wherein these solids are to be considered as the connecting elements made of magnetic flux-conducting material within the scope of the invention.

Through the crystallographic texture it is achieved that losses as a result of the magnetic hysteresis are significantly reduced, which results in an improved output of the apparatus in terms of the conversion of thermal energy into electric energy.

For a particularly advantageous magnetic flux, primarily soft magnetic materials, in particular Fe—Si alloys and/or amorphous Fe-based alloys can be used for the connecting elements made of magnetic flux-conducting material.

In an advantageous embodiment of the invention, the thermomagnetic components respectively comprise at least one heat supply device and at least one heat dissipation device, wherein regulating devices and/or control devices can additionally be present. With the heat supply devices and heat dissipation devices, a targeted and direct heat supply to the thermomagnetic components and a targeted and direct heat dissipation from the thermomagnetic components are achieved. In addition, a rapid switch between heating and cooling of the thermomagnetic material is possible, which results in a rapid reversal of the magnetic flux in the thermomagnetic generator.

In a particularly advantageous embodiment of the apparatus, the at least two connecting elements made of magnetic flux-conducting material are respectively embodied to be annularly closed. In a technical implementation, the connecting elements embodied to be annularly closed can be designed as polygons with n sides.

An inner ring of a connecting element made of magnetic flux-conducting material and an outer ring as a connecting element made of magnetic flux-conducting material are thereby embodied, wherein the inner ring has a smaller circumference than the outer ring. 2n induction coils are wound around the outer ring, and n thermomagnetic components and n permanent magnets are located between both rings. This annular closed arrangement has an even number 2n of magnetic field circuits.

Such an advantageous annularly closed arrangement of the thermomagnetic generator enables the thermomagnetic generator to be set in rotation, so that the thermomagnetic components are alternatingly heated and cooled by the heat supply devices that are, for example, arranged above the apparatus. The current induced in the coils can, for example, be guided outward via sliding contacts.

An advantage of this arrangement of the apparatus is that no electric energy is required for the operation of valves in the heat supply devices and heat dissipation devices; instead, the flow energy of the media is utilized and the efficiency thus increased. Additionally, a further advantage is that the media can be supplied from above and the potential energy thereof can thus be utilized without an additional pump being necessary for the heat supply or heat dissipation with a corresponding pressure buildup.

Advantageously, the apparatus can be composed of two or more thermomagnetic generators which are connected in series as a cascade, wherein the first and second thermomagnetic components of one thermomagnetic generator in a cascade have different Curie temperatures than the other first and second thermomagnetic components of the other thermomagnetic generators in the cascade.

With the arrangement of two or more thermomagnetic generators in series as a cascade, a higher yield of the available thermal energy as electric energy is possible, which leads to an improved efficiency in ter ins of the available thermal energy and the conversion into electric energy.

It was possible to establish that, with the thermomagnetic generator according to the invention, a change in the magnetic flux in the at least one coil is realized that is twice as large, for example. This results in the output of the thermomagnetic generator according to the invention being many times improved over the prior art as a result of the quadratic relationship between flux change and output.

By avoiding gaps between the thermomagnetic components, the components made of hard magnetic material and the connecting elements made of magnetic flux-conducting material, a thermomagnetic generator with a particularly advantageous high permeability is provided with which in particular magnetic stray fields in the air are minimized and the properties of the magnetic materials used are optimally utilized and applied.

The invention is explained below in greater detail with the aid of two exemplary embodiments.

Figure 2:
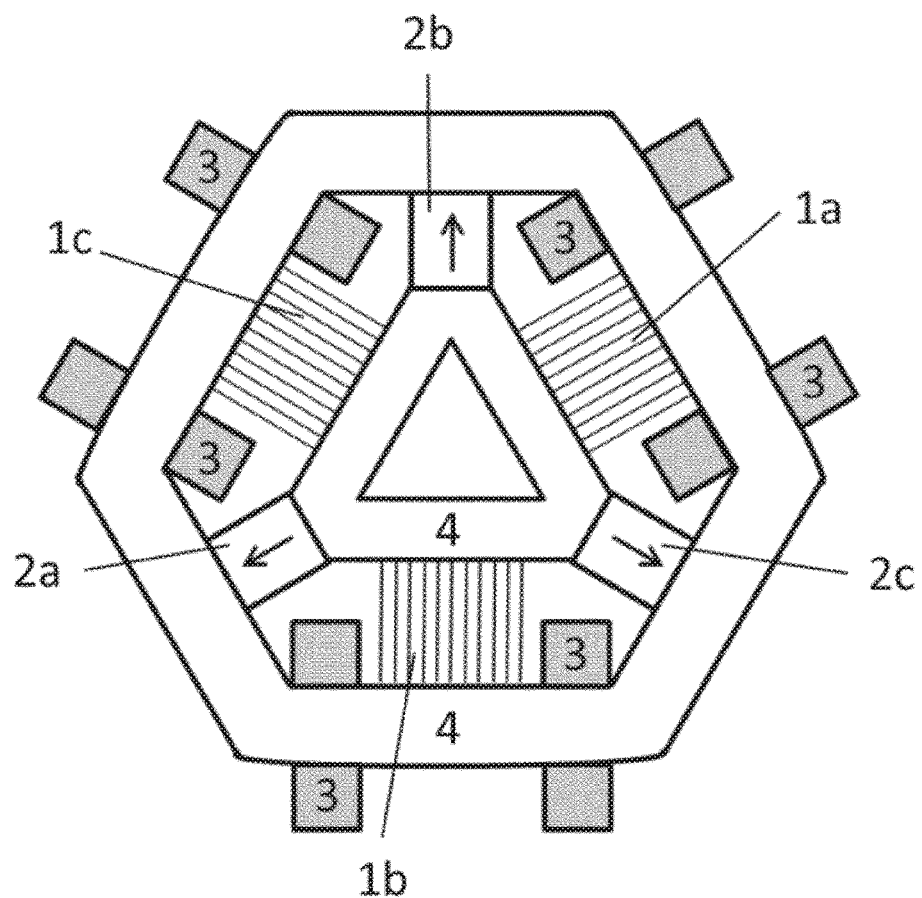

In this matter:

FIG. 1 shows a schematic embodiment of the apparatus with a parallel arrangement of the connecting elements made of magnetic flux-conducting material, and FIG. 2 shows a schematic embodiment of the apparatus with a triangular arrangement of the connecting elements made of magnetic flux-conducting material.

EXEMPLARY EMBODIMENT 1

An apparatus according to the invention with a thermomagnetic generator comprises, between horizontally arranged upper and lower connecting elements made of soft magnetic material (4) as connecting elements made of magnetically flux-conducting material, a first magnetocaloric component (1$a$) bounding on the left side and a second magnetocaloric component (1$b$) bounding on the right side as thermomagnetic components. Each magnetocaloric component (1$a$, 1$b$) is composed of 25 plates that are made of La(FeCoSi)$_{13}$. The plates of each magnetocaloric component (1$a$, 1$b$) are arranged parallel to one another and transversally to the alignment of the connecting elements made of soft magnetic material (4) at a distance of 0.5 mm.

Permanent magnets (2) are arranged as hard magnetic components next to the magnetocaloric components (1$a$, 1$b$), which permanent magnets (2) each have a magnetic flux density of 1.47 T. The magnetic north poles of the permanent magnets (2), which poles are illustrated as arrow tips, are connected to the upper connecting element made of soft magnetic material (4), and the south poles thereof, which are illustrated by the arrow tails, are connected to the lower connecting element made of soft magnetic material (4). Between the two permanent magnets (2), two coils (3), each with a length of 50 mm, are arranged around the connecting elements made of soft magnetic material (4), for which coils the coil cores are formed by regions of the connecting elements made of soft magnetic material (4).

In a resting state of the thermomagnetic generator, the magnetocaloric components (1a, 1b) are each at ambient temperature and thus have an identical magnetic resistance. A magnetic flux is not present in the two coils (3) since the flux generated by the permanent magnets is uniformly distributed to the magnetocaloric components.

A fluid at different temperatures then flows through the magnetocaloric components (1a, 1b) perpendicularly to the direction of the magnetic flux in the connecting elements made of soft magnetic material, wherein the first magnetocaloric component (1a) is heated and the second magnetocaloric component (1b) is cooled. The temperature difference between the hot and the cold fluid flowing through the magnetocaloric components is $\Delta T=30K$. This causes the magnetization in the magnetocaloric components and the magnetic resistance in the connecting elements made of soft magnetic material to change. A directed magnetic flux is generated by the permanent magnets (2), wherein an electric current is induced as a result of the change in the magnetic flux as it flows through the two coils (3) along the coil axes. Then, the first magnetocaloric component (1a) is cooled and simultaneously the second magnetocaloric component (1b) is heated again, until the two magnetocaloric components have reached ambient temperature, wherein an electric current is thereby likewise induced in the coils (3) due to the change in the magnetic flux.

A fluid at different temperatures then flows through the magnetocaloric components (1a, 1b) perpendicularly to the direction of the magnetic flux in the connecting elements made of soft magnetic material, wherein this time the second magnetocaloric component (1b) is heated and the first magnetocaloric component (1a) is cooled. The temperature difference between the hot and the cold fluid flowing through the magnetocaloric components (1a, 1b) is $\Delta T=30K$. This causes the magnetization in the magnetocaloric components (1a, 1b) and the magnetic permeability thereof to change. A directed magnetic flux is generated by the permanent magnets (2), wherein an electric current is induced as a result of the change in the magnetic flux as it flows through the two coils (3) along the coil axes. Then, the second magnetocaloric component (1b) is cooled and simultaneously the first magnetocaloric component (1a) is heated again, until the two magnetocaloric components (1a, 1b) have once again reached ambient temperature, wherein an electric current is thereby likewise induced in the coils (3) due to the change in the magnetic flux.

The change in the magnetic flux achieved by the thermomagnetic generator is $\Phi_{max}=4.836\times10^{-5}$ Wb and $\Phi_{min}=-4.836\times10^{-5}$ Wb. This results in a flux change of $\Delta\Phi=\Phi_{max}-\Phi_{min}=9.672\times10^{-5}$ Wb, which corresponds to a flux density change of 0.77 T. The electric output generated per coil (3) is 0.306 W, whereby an overall electric output of 0.61 W is obtained.

EXEMPLARY EMBODIMENT 2

A thermomagnetic generator comprises, between an outer and an inner ring made of soft magnetic material (4), three thermomagnetic components (1a-c) and three permanent magnets (2a-c), which are each arranged in a triangle. In addition, on the outer ring made of soft magnetic material (4), six coils (3) are respectively arranged between the thermomagnetic components (1a-c) and the permanent magnets (2a-c), so that a voltage is induced in the coils (3) by the change in the magnetic flux. The specifications for the thermomagnetic components (1a-c) and the permanent magnets (2a-c) are selected analogously to Exemplary Embodiment 1; the magnetocaloric components (1a-c) are composed of 38 plates in order to accommodate the flux from three permanent magnets. The north poles of the permanent magnets (2a-c) are illustrated by the arrow tips, and are respectively connected to the outer ring. The south poles of the permanent magnets (2a-c) are illustrated by the arrow tails, and accordingly are magnetically connected to the inner ring made of soft magnetic material (4). The magnetic connection of the two poles of the permanent magnets (2a-c) to the inner and outer ring made of soft magnetic material (4) is by a gluing with a ferromagnetic glue. The illustrated structure has a total of 3 mirror planes which are oriented perpendicularly to the image plane. These mirror symmetries do not include the wiring of the coils.

In the resting state, the thermomagnetic components (1a-c) are each at ambient temperature, have an identical magnetization, and therefore have an identical magnetic resistance. This results in a magnetic flux which respectively flows from the permanent magnets through the two adjacent coils and the adjacent thermomagnetic components and back to the permanent magnets via the inner ring. Thus, a total of 6 magnetic field circuits are present in this structure.

Two of the three thermomagnetic components (1b and 1c) are then heated and the remaining thermomagnetic component (1a) cooled in that fluids or gases at a different temperatures flow through the components. As a result, the magnetization in the heated magnetocaloric components (1b and 1c) decreases and the magnetization in the cooled thermomagnetic component (1a) increases. The magnetic flux from the permanent magnet (2a) that is arranged across from the cooled thermomagnetic component (1a) then no longer flows back to the permanent magnet (2a) via the adjacent thermomagnetic components (1b and 1c), but rather via the cooled thermomagnetic component (1a). The flux from the other two permanent magnets (2b and 2c) also flows over the cooled thermomagnetic component (1a). As a result, the flux direction in the coils (3) reverses between the permanent magnets (2b and 2c) adjacent to the cooled thermomagnetic component (1a) and the heated thermomagnetic components (1b and 1c), and an electric voltage is induced. In addition, the magnetic flux increases in the coils (3) adjacent to the cooled thermomagnetic component (1a), whereby an electric voltage is likewise induced.

The next thermomagnetic component (1b) in a clockwise direction is then cooled, and the previously cooled thermomagnetic component (1a) is heated. As a result, the magnetization in the now heated thermomagnetic component (1a) decreases and the magnetization in the now cooled thermomagnetic component (1b) increases. The magnetic flux from all permanent magnets (2a-c) then flows over the cooled thermomagnetic component (1b). This causes a change in the magnetic flux, and an electric voltage is induced in all coils (3). In the coils (3) adjacent to the thermomagnetic component (1c) and in the coil (3) between the now heated thermomagnetic component (1a) and the adjacent permanent magnet (2c) in a clockwise direction, the polarity sign of the magnetic flux direction thereby also changes.

The heating and cooling process is subsequently continued in a cyclical manner in that the next thermomagnetic component in a clockwise direction is cooled and the previously cooled thermomagnetic component is heated. As a result, the magnitude of the magnetic flux in all six coils changes, whereby an electric voltage is induced. In three of the six coils respectively, the polarity sign of the magnetic flux direction also changes, which is particularly advantageous for the reasons indicated above.

To collectively utilize the output of the individual coils, these alternating voltages are rectified and electrically connected by means of diodes.

The cyclical heating and cooling using water as a medium is realized in the following manner: The supply of the cold and hot media takes place perpendicularly to the image plane and is realized through 6 stationary channels that are arranged in rotational symmetry around the rotation axis. Hot water flows out of every second channel; cold water flows out of the others. A shaft around which the structure can rotate is located in the middle of the structure. If the thermomagnetic generator is set in rotation, the thermomagnetic components become alternatingly cold and hot according to the invention. To set the structure in rotation, additional plates are attached beneath the thermomagnetic plates, which additional plates set the structure in rotation using the flowing water, similar to a windmill or turbine. The slant is selected such that the rotational speed allows a maximum usable output of the thermomagnetic generator. Thus; for this exemplary embodiment, no electric energy is needed for the operation of valves; instead, the flow energy of the media is utilized and the efficiency thus increased.

The described structure can be expanded to include any desired number of thermomagnetic components and permanent magnets in cyclical arrangement. In all operating states, the magnetic flux is guided in a magnetic material, that is, in the connecting elements made of magnetic flux-conducting material, in the components made of hard magnetic materials, and in the thermomagnetic components.

LIST OF REFERENCE NUMERALS 1a, 1b, 1c Thermomagnetic components
2, 2a, 2b, 2c Permanent magnets
3 Coils
4 Connecting elements made of magnetic flux-conducting material

The invention claimed is:

1. An apparatus for converting thermal energy into electric energy, comprising:
one or more thermomagnetic generators, wherein a thermomagnetic generator contains at least one first and one second thermomagnetic component,
at least two components made of hard magnetic material, at least one coil, and
at least two connecting elements made of magnetic flux-conducting material, wherein
the thermomagnetic components and the at least two components made of hard magnetic materials are respectively arranged such that they are locally separate from one another, and wherein
the thermomagnetic components and the components made of hard magnetic material are connected to the at least two connecting elements made of magnetic flux-conducting material, and wherein
the thermomagnetic components are arranged such that they are locally separate from the at least one coil, and wherein
the at least one coil comprises as a coil core at least one subregion of the connecting element made of magnetic flux-conducting material, and wherein
the at least two thermomagnetic components, the at least two connecting elements made of magnetic flux-conducting material, the at least two components made of hard magnetic material, and the at least one coil are embodied to form at least two magnetic circuits, wherein the magnetic north poles of the at least two components made of hard magnetic material are connected to one of the two connecting elements made of magnetic flux-conducting material, and the magnetic south poles thereof are connected to the other connecting element of the two connecting elements made of magnetic flux-conducting material,
wherein the thermomagnetic components and the at least two components made of hard magnetic material are each arranged locally separated from one another by the at least one coil, wherein the at least two thermomagnetic components, the at least two connecting elements made of magnetic flux-conducting material, the at least two components made of hard magnetic material form at least two magnetic circuits, so that the direction of the magnetic flux within the at least one coil is reversible, and
wherein the at least two thermomagnetic components comprise a heat supply device and/or a heat dissipation device that include regulating devices and/or control devices.

2. The apparatus according to claim 1 in which the thermomagnetic components and the components made of hard magnetic material are connected magnetically to the at least two connecting elements made of magnetic flux-conducting material.

3. The apparatus according to claim 1 in which the thermomagnetic components contain at least one magnetocaloric material which is one of La—Fe—Si, Fe2P, and/or one or more Heusler alloys.

4. The apparatus according to claim 1 in which the magnetic circuits composed of the thermomagnetic components, the at least two components made of hard magnetic material and at least two connecting elements made of magnetic flux-conducting material are arranged in an opposing manner with mirror symmetry.

5. The apparatus according to claim 1 in which the thermomagnetic material exhibits a change in magnetization of $M>50\%$ at a temperature change of up to 20 Kelvin.

6. The apparatus according to claim 1 in which the thermomagnetic components are present in the form of powder, tubes, plates, mesh, grids, bands, wires, and/or rods.

7. The apparatus according to claim 1 in which the component made of hard magnetic material is a permanent magnet.

8. The apparatus according to claim 7, wherein the permanent magnet is made of Nd—Fe—B.

9. The apparatus according to claim 1 in which the at least two connecting elements made of magnetic flux-conducting material are embodied to be annularly closed.

10. The apparatus according to claim 1 in which the at least two connecting elements made of magnetic flux-conducting material are made of soft magnetic material.

11. The apparatus according to claim 10, wherein the soft magnetic material comprises at least one of Fe—Si or amorphous Fe-based alloys.

12. The apparatus according to claim 1 in which the at least two connecting elements made of magnetic flux-conducting material comprise, at least in the region of the at least one coil, one or more crystallographic textures.

13. The apparatus according to claim 1 in which the thermomagnetic components each comprise at least one heat supply device and each comprise at least one heat dissipation device.

14. The apparatus according to claim 1 in which the multiple thermomagnetic generators are connected in series as a cascade.

15. The apparatus according to claim 14 in which the first and second thermomagnetic components of one thermomagnetic generator in a cascade respectively have different Curie temperatures than the other first and second thermomagnetic components of the other thermomagnetic generators in the cascade.

16. A method for converting thermal energy into electric energy of via the apparatus according to claim 1, comprising:

heating a first thermomagnetic component and simultaneously cooling a second thermomagnetic component, whereby the magnetization in the thermomagnetic components is changed and, at the same time, a directed magnetic flux is realized in a first magnetic circuit by the hard magnetic components, and electric energy is induced in the at least one coil by the magnetic flux change in the at least two connecting elements made of magnetic flux-conducting material, and subsequently cooling the first thermomagnetic component and simultaneously heating the second thermomagnetic component is heated, whereby the magnetization in the thermomagnetic components is changed and, at the same time, an oppositely directed magnetic flux is realized in a second magnetic circuit by the hard magnetic components, and electric energy is induced in the same at least one coil by a change in direction of the magnetic flux over the at least two connecting elements made of magnetic flux-conducting material.

\* \* \* \* \*